United States Patent [19]

Michel et al.

[11] Patent Number: 5,748,649
[45] Date of Patent: May 5, 1998

[54] SYSTEM ENABLING A MAGNETIC CODE RECORDED ON A MAGNETIC TRACK TO BE PROPERLY DECODED IN THE FORM OF A BINARY MESSAGE

[75] Inventors: Jacques Michel, L'Hay les Roses; Dominique Trouche, Montgeron, both of France

[73] Assignee: Compagnie Generale d'Automatisme CGA-HBS, Bretigny sur Orge, France

[21] Appl. No.: 733,452

[22] Filed: Oct. 18, 1996

[30] Foreign Application Priority Data

Oct. 20, 1995 [FR] France .................. 95 12368

[51] Int. Cl.$^6$ ........................... G11B 20/18
[52] U.S. Cl. ............... 371/40.16; 371/40.3; 371/55
[58] Field of Search ..................... 371/40.16, 40.3, 371/55

[56] References Cited

U.S. PATENT DOCUMENTS

| 5,251,077 | 10/1993 | Saitoh | 360/53 |
| 5,390,195 | 2/1995 | Brush | 371/37.1 |

FOREIGN PATENT DOCUMENTS

0407101A2  1/1991  European Pat. Off. .

OTHER PUBLICATIONS

Patent Abstracts of Japan, vol. 12, No. 380 (P-769) 12 Oct. 1988 corresponding to JP-A-63 126080 (Fujitsu) dated May 30, 1988.

Patent Abstracts of Japan, vol. 12, No. 243 (P-768) 7 Jun. 1989 corresponding to JP-A-01 044627 (Fujitsu) dated Feb. 17, 1989.

Patent Abstracts of Japan, vol. 12, No. 154 (P-700) 12 May 1988 corresponding to JP-A-62 271261 dated Nov. 25, 1987.

*Primary Examiner*—Stephen M. Baker
*Attorney, Agent, or Firm*—Sughrue, Mion, Zinn, MacPeak & Seas, PLLC

[57] ABSTRACT

The magnetic code may include a run of $\underline{b}$ spoiled bits in a position that is locatable. The system consists in adding a check structure of $\underline{k}$ bits to the m-bit message in such a manner that the resulting n-bit word n=m+k is a cyclic redundancy code word generated by a generator polynomial G(x) of degree $\underline{k}$ that divides $x^n-1$ without remainder in modulo-2 algebra. On reading, the system locates a packet of spoilt bits by detecting magnetic spoiling of the track which should normally be in the form of magnets of length $l_1=l\pm l/2$ and $l_2=2l\pm l/2$, with there being no runs of an odd number of successive magnets of length $l_1$, given the bi-phase code used. A detected error is corrected by applying the relationship G(x) to the message as read after circular permutation has been applied thereto to move the missing bits to the end of the message.

11 Claims, 1 Drawing Sheet

SYSTEM ENABLING A MAGNETIC CODE RECORDED ON A MAGNETIC TRACK TO BE PROPERLY DECODED IN THE FORM OF A BINARY MESSAGE

The present invention relates to a system enabling a magnetic code recorded on a magnetic track deposited on a medium to be decoded correctly in the form of a binary message, said magnetic code possibly including locatable spoiling over a length corresponding to a number $\underline{b}$ of bits referred to as an "error packet", said magnetic code being of a type that causes unit magnets of lengths $l_1 = l \pm l/2$ and $l_2 = 2l \pm l/2$ to appear in the magnetic track.

BACKGROUND OF THE INVENTION

Because of their use by the public, recordings on media such as tickets, cards, etc. . . . are subject to damage and spoiling of magnetically recorded messages. This applies most particularly to flexible media which are sometimes subjected to folding that usually spoils the magnetic material and thus spoils the recorded information.

A known technique for overcoming such a drawback consists in repeating the recorded message a second time. Nevertheless, it is still necessary to provide both messages with additional information making it possible to detect when one of the messages, but only one of them, is erroneous, so as to retain the other message.

That technique suffers from the drawback, for given linear bit density, of doubling the length required for recording a message, or of severely restricting the possible length of a message on a magnetic track medium of given length.

OBJECTS AND SUMMARY OF THE INVENTION

An object of the present invention is to overcome such a drawback and to propose a system enabling a missing or erroneous block of information to be reconstituted providing there is only one such block of bits, referred to as an "error packet", and providing that it can be located. Under other circumstances, the invention makes it possible to detect that the message is wrong, but not to correct it.

The invention is based on the principle of using, in association, both a cyclic redundancy code (CRC), which is a known redundancy code possessing particular properties, and a particular error locating technique that is applicable to magnetic recordings.

In general, redundancy codes are based on the principle whereby a set of check bits is added to a block of binary information, said check bits being defined by a relationship or function applied to the data bits.

Thus, for an m-bit data message, $\underline{k}$ check bits are added, so that the final message forms an n-bit word where $n = m+k$.

The relationship for generating the check structure is such that for a given message, e.g. an m-bit message, there exists only one k-bit check structure. In contrast, several distinct m-bit messages have the same k-bit check structure if $k<m$. Thus, for an m-bit message there are $2^m$ possible configurations. For each of these $2^m$ configurations $\underline{k}$ check bits are added. This therefore gives rise to $2^m$ configurations of $m+k=n$ bits. The set of these $2^m$ m-bit configurations is called a "redundancy code" and a particular configuration of this code is called a code word. It will be understood that a redundancy code containing $2^m$ n-bit code words constitutes a subset of the $2^n$ possible configurations of $n=m+k$ bits.

Error detection consists in verifying whether the available n-bit message is indeed a word of the redundancy code. This is done by applying the relationship for generating the $\underline{k}$ check bits to the $\underline{m}$ bits of the data message and then comparing the $\underline{k}$ bits found by applying the relationship to the bits actually present in the n-bit word as read.

Redundancy codes include cyclic redundancy codes. A cyclic redundancy code is a particular redundancy code that not only satisfies the general definition given above for redundancy codes, but that also possesses the remarkable characteristic property whereby any cyclic permutation of a code word also constitutes a code word.

This remarkable property makes it possible to correct an error which occurs in packet form, i.e. an error constituted by a continuous run of bits, providing the error can be located. This remarkable property means that no pair of code words can exist having the same structure outside an arbitrary packet of k-successive bits (where $\underline{k}$ is the number of bits in the control structure). This therefore makes it possible to correct an error concerning a packet of bits of length $\leq k$ with certainty, providing the error packet can be located.

A cyclic redundancy code having words of length $\underline{n}$ bits comprising $\underline{m}$ data bits and $\underline{k}$ check bits ($n=m+k$) is thus constituted by a family of C distinct cyclic configurations of $\underline{n}$ bits each, such that the $2^m$ n-bit configurations that correspond to the $\underline{m}$ data bits are all obtained and are the only configurations that are obtained by the set of circular permutations of all of the cyclic configurations of the code.

A cyclic redundancy code whose words are of length $\underline{n}$ bits and including $\underline{k}$ check bits is written $C(n,n-k)=C(n,m)$.

To generate a cyclic redundancy code $C(n,m)$, the following procedure is applied: an n-bit binary word is represented by an n-term polynomial $N(x)$ of degree $n-1$:

$$N(x) = a_{n-1} x^{n-1} + a_{n-2} x^{n-2} + \ldots + a_i x^i \ldots + a_1 x^1 + a_0 x^0$$

Thus, consecutive terms are of degree $n_i$ that decreases by unity going from left to right, starting at degree $n-1$ and ending at degree 0. The degree $n_i$ of a term is thus representative of the location of the bit it represents in the n-bit structure.

The coefficient $a_i$ of a term is equal to 0 or to 1 depending on the value 0 or 1 of the bit represented by the term.

Thus, the following binary word:
11100110101
is represented by the following polynomial:
$1.x^{10} + 1.x^9 + 1.x^8 0.x^7 + 0.x^6 + 1.x^5 + 1.x^4 + 0.x^3 + 1.x^2 + 0.x + 1$ Naturally, the zero terms are removed, so it reduces to:
$x^{10} + x^9 + x^8 + x^5 + x^4 + x^2 + 1$ However, when translating a polynomial into bits, it is necessary to place the 0 corresponding to the missing terms.

That said, cyclic redundancy code theory shows that:

An n-bit word belongs to a cyclic redunancy code having $\underline{k}$ check-structure bits if the polynomial representing said $\underline{n}$ bits is divisible without remainder by a generator polynomial $G(x)$ of degree $\underline{k}$ when using modulo-2 algebra. This generator polynomial $G(x)$ of degree $\underline{k}$ must also be a divisor of the polynomial $x^n - 1$.

It is recalled that modulo-2 algebra without remainder possesses only the following two digits: 0 and 1.

a) Addition:

$0+0=0$ $0+1=1$ $1+1=0$ $1-1=0$

+ and − are identical. This operation is commutative and associative.

b) Multiplication: $0 \times 1 = 0 \quad 1 \times 1 = 1$
$0 \times 0 = 0$ this operation is commutative and associative. A property of this algebra is the following:

$f^2(x)=f(x^2)$ for example: $(1+x+x^2)^2=1+x^2+x^4$

To find a polynomial $G(x)$ that generates a cyclic redundancy code $C(n,n-k)$, it is therefore necessary to find the prime factors of $x^n-1$, and if there exists a polynomial of degree $\underline{k}$ amongst said prime factors or obtainable by multiplying together a plurality of said prime factors, then said polynomial is a polynomial $G(x)$ that generates a code $C(n,n-k)$.

This is not necessarily possible. In which case, the number $\underline{n}$ of bits is increased so as to make it possible to find a generator polynomial $G(x)$ for generating a code $C(n_1,n_1-k)$, where $n_1=n+n'$.

Once that has been done, the $\underline{n}$ bits are preceded in the logic by n' zero bits.

Under such circumstances, a cyclic redundancy code word comprises n'+n bits and account must be taken thereof in the circular permutations.

Once a polynomial $G(x)$ has been found for generating a code $C(n,n-k)$, to determine the $\underline{k}$ bits of the check structure that is to be added to a m-bit messages, the procedure is as follows:

$\underline{k}$ zero bits are added to the $\underline{m}$ data bits. An n-bit word is thus obtained. This n-bit word is represented by its representative polynomial of degree n-1 as explained above, and the polynomial is divided by $G(x)$. A remainder will be obtained which is a polynomial of degree k-1, i.e. having $\underline{k}$ terms. These $\underline{k}$ terms are representative of a binary combination of $\underline{k}$ terms that are substituted for the $\underline{k}$ zero bits.

When it is said that the remainder is a polynomial of degree k-1, that means that it represents $\underline{k}$ bits but, it can happen that the representative polynomial is of lower degree, e.g. of degree k-2, which means that the term of degree k-1 is absent and therefore represents a 0.

Example: consider a four-bit binary message 0001: m=4.

It is desirable to be able to detect an error, and to be able to correct it providing: it is capable of being located; is unique; and is in the form of a packet of up to three consecutive bits.

Three check bits: k=3 are therefore added to these four bits so that the resulting seven-bit word n=7=m+k is a word of a cyclic redundancy code $C(n,n-k)=C(7,4)$, which means that it is necessary to find a $G(x)$ that divides $x^n-1=x^7-1$ and which is a polynomial of degree k=3.

$$x^7-1=(x^3+x+1)(x^4+x^2+1)$$

so the polynomial $x^3+x+1$ is thus a $G(x)$ suitable for generating a code $C(7,4)$.

To find the $\underline{k}$ bits to be added to 0001, three zero bits are added to 0001, i.e.: 0001000, which is represented by the polynomial $x^3$ (all the other terms are 0).

Dividing $x^3$ by $G(x)$ gives a remainder of $x+1$ which represents the message: 011. Therefore the $\underline{k}$ (three) zero bits added to the message are replaced by 011, i.e.:

0001011, which is a word of the cyclic redunancy code $C(7,4)$ and in this word, the $\underline{k}$ bits 011 constitute the check structure for the data message 0001.

The invention thus provides a system enabling a magnetic code recorded on a magnetic track deposited on a medium to be decoded properly in the form of a binary message, said magnetic code possibly including locatable spoiling over a length corresponding to a number $\underline{b}$ of bits referred to as an "error packet", said magnetic coding being of a type that causes elementary magnets to appear on the magnetic track of length $l_1=l\pm l/2$ and of length $l_2=2l\pm l/2$, wherein a check structure in the form of a unitary packet of $\underline{k}$ bits is integrated in the message at a known location, said $\underline{k}$ bits being magnetically recorded on the track and being determined in such a manner that taken together, the message and the control structure constituting an n-bit word, belongs to a cyclic redundancy code $C(n,n-k)$ generated by a relationship, wherein the location of the beginning of any spoiling encountered during reading, is determined by observing one or other of the following events:

a) a magnet of length>5l/2 is detected;

b) a magnet of length<l/2 is detected;

c) a continuous run comprising an odd number of magnets of length $l_1$ is detected;

wherein, in such an event, the magnetic decoding into binary units stops at the decoded bit of rank $N_1-1$ corresponding to the last magnet of correct length preceding event a) or b) or to the last magnet of length $l_2$ preceding event c), the end of the spoiling being located in the same manner, but by reading the n-bit word in the opposite direction, thereby obtaining decoding in the opposite direction as far as the last properly decoded bit of rank $N_2+1$ counting from the same origin as for the bit of rank $N_1-1$, and wherein the non-decoded bits of ranks $N_1$ to $N_2$ included, of number $b=N_2-(N_1-1)$ are determined by applying circular permutation to the $\underline{n}$ bits so as to place the $\underline{b}$ non-decoded bits at the end of the configuration, and by applying said relationship for generating the cyclic redundancy code that was used to determine said $\underline{k}$ check structure bits to said configuration with the $\underline{b}$ missing bits being provisionally reset to zero, the $\underline{b}$ bits found by applying the relationship then being returned to their original position by a new circular permutation.

The invention also provides a system enabling a magnetic code recorded on a magnetic track deposited on a medium to be decoded properly in the form of a binary message, said magnetic code possibly including locatable spoiling over a length corresponding to a number $\underline{b}$ of bits referred to as an "error packet", said magnetic coding being of a type that causes elementary magnets to appear on the magnetic track of length $l_1=l\pm l/2$ and of length $l_2=2l\pm l/2$, wherein a check structure in the form of a unitary packet of $\underline{k}$ bits is integrated in the message at a known location, said $\underline{k}$ bits being magnetically recorded on the track and being determined in such a manner that taken together, the message and the control structure constituting an n-bit word, belongs to a cyclic redundancy code $C(n,n-k)$ generated by a relationship, wherein the location of the beginning of any spoiling encountered during reading, is determined by observing one or other of the following events:

a) a magnet of length>5l/2 is detected;

b) a magnet of length<l/2 is detected;

c) a continuous run comprising an odd number of magnets of length $l_1$ is detected;

wherein, in such an event, the magnetic decoding into binary units stops at the decoded bit of rank $N_1-1$ corresponding to the last magnet of correct length preceding event a) or b) or to the last magnet of length $l_2$ preceding event c), decoding then continuing from rank $N_1+k$, written as $N_2+1$, thereby decoding the $\underline{n}$ bits with the exception of the $\underline{k}$ bits of ranks $N_1$ to $N_2$ included, and wherein these $\underline{k}$ bits are determined by applying circular permutation to the $\underline{n}$ bits so as to place the $\underline{k}$ non-decoded bits at the end of the configuration, and by applying said relationship for generating the cyclic redundancy code that was used to determine said $\underline{k}$ check-structure bits to said configuration with the $\underline{k}$ missing bits being provisionally reset to zero, the $\underline{k}$ bits found by applying the relationship then being returned to their original position by a new circular permutation.

Thus, in this case, an error packet is located only by looking for its start, and it is assumed that the error packet is $\underline{k}$ bits long.

According to another characteristic, the n-bit word comprises m=n–k bits made up of m1 start-of-message bits, m2 message data bits, m3 end-of-message bits, and m4 padding bits, where m4 is zero if there exists a cyclic redundancy code of length n=m+k=m1+m2+m3+k with $\underline{k}$ check bits, written C(n,n–k) and being non-zero otherwise, in which case m4 is chosen so as to increase the sum m1+m2+m3+k by as little as possible for there to exist a code C(n,n–k).

In a preferred embodiment, where it is necessary to have the number m4 of padding bits, they exist logically only without being recorded magnetically on the magnetic track. Preferably, these m4 bits are logic 0s, but that is not essential.

In a preferred embodiment, the $\underline{n}$ bits are recorded on the magnetic track in the following order:

m1, m2, k, m3.

Naturally, during the operation of searching for the $\underline{k}$ check bits to be added to the message m=m1+m2+m3, it is necessary, by circular permutation, to apply the cyclic redundancy code generator relationship G(x) to the message in the following order: m3, m1, m2, followed by $\underline{k}$ zero bits. Once the $\underline{k}$ bits have been found, the magnetic message is recorded on the track in the following order: m1, m2, $\underline{k}$, m3.

It would also be possible to record the message magnetically in the following order: m1, k, m2, m3.

In which case, to find the $\underline{k}$ bits, it is necessary to perform the circular permutation that brings the message into the following order: m2, m3, m1, followed by $\underline{k}$ zero bits, and once the $\underline{k}$ bits have been determined for substituting the $\underline{k}$ zero bits, the message is recorded magnetically in the order: m1, $\underline{k}$, m2, m3.

Preferably, when there are four padding bits, they are placed in front of the m1 bits, regardless of whether they are recorded magnetically or present logically only.

As explained above, the relationship for generating the cyclic redundancy code C(n,n–k) is a generator polynomial G(x) of degree $\underline{k}$ that divides into the polynomial $x^n-1$ in modulo-2 algebra without remainder.

Thus, the invention consists in using a cyclic redundancy code (CRC) in association with an error-locating technique.

BRIEF DESCRIPTION OF THE DRAWING

An example is described below with reference to the accompanying drawing, in which.

MORE DETAILED DESCRIPTION

The message to be written is the following: 10100011011. This message comprises $\underline{m}$ bits, i.e. m=11. It is subdivided as follows:

m1 start-of-message bits: m1=2→10 m2 message data bits: m2=6→1000110 m3 end-of-message bits: m3=2→11 m=11=m1+m2+m3 in which it is desired to be able to correct a packet of up to three bits, so it is necessary to add three check bits: k=3.

These three bits are to be recorded on the track between m2 and m3, i.e. as follows:

101000110. . . 11

This word must form part of a CRC C(n,n–k)=C(14,11).

Does there exist a generator polynomial G(x) of degree k=3 making such a code possible? It must be a divisor of $x^n-1=x^{14}-1$. Such a polynomial exists, it is: $G(x)=x^3+x+1$ which represents 1011.

To find the $\underline{k}$ bits that are to replace the dots, the fourteen-bit message is subjected to circular permutation so as to place the $\underline{k}$ bits that are to be determined at the end of the word, and they are provisionally given the value zero. This gives:

11101000110000

When this is divided by G(x), i.e. by 1011, the remainder is 001, so the code word becomes:

11101000110001

For recording on the magnetic track, circular permutation is performed again so as to place the three check bits 001 between m2 and m3.

The following is therefore written:

10100011000111

Figure 1:
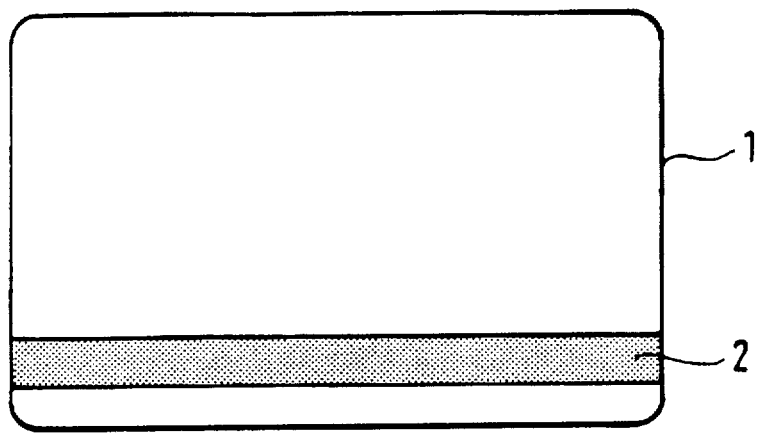
FIG. 1 shows a magnetic ticket.

FIG. 1 shows a card 1 carrying a magnetic track 2.

Figure 2:
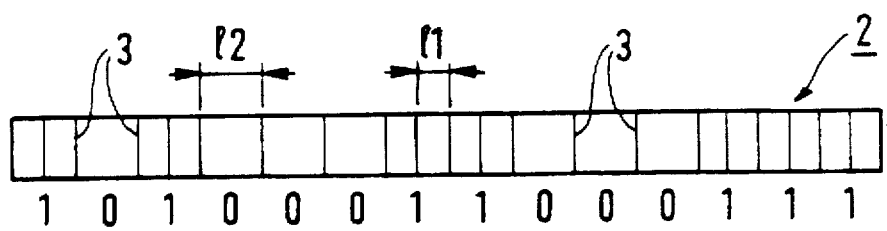
FIG. 2 shows the coding of the magnetic track.

FIG. 2 shows the magnetic coding on the magnetic track 2.

Figure 3:
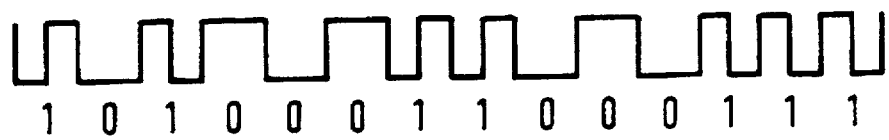
FIG. 3 shows the signal decoded on reading the track.

FIG. 3 shows the signal that results from reading the magnetic track.

Figure 4:
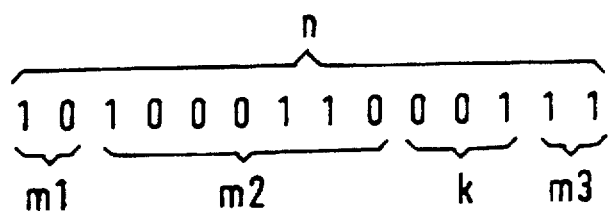
FIG. 4 shows the message.

FIG. 4 shows the decoded message.

The coding used is bi-phase mark coding, which causes magnets to appear on the track that are either of single length 1 or of double length 21 with tolerance of ±1/2 for each magnet: magnets thus come in two lengths: $l_1=l\pm 1/2$ and $l_2=2l\pm 1/2$.

FIG. 3 shows the signal that results from reading the magnetic track 2.

FIG. 4 shows the binary message subdivided into its portions: m1 start-of-message bits, m2 message data bits, $\underline{k}$ check bits, and m3 end-of-message bits.

Reading takes place at constant speed, so the duration between two magnetic transitions as represented by vertical lines 3 in FIG. 2 is thus proportional to the length $l_1$ or $l_2$.

A table is thus obtained giving a sequence of lengths $l_1$ or $l_2$ which is subsequently translated into 0 bits and 1 bits.

The beginning of an error packet in the message as read is located by detecting one of the following events:

a) a magnet length greater 5l/2;

b) a magnet length less than l/2;

c) an odd number of successive short magnets $l_1$.

Under such circumstances, decoding stops at the last properly decoded bit and is restarted either $\underline{k}$ bits further on (k=3 in the example described), or else decoding is performed by reading the track from its other end so as to detect the end of the error.

Once the error has been located, the packet of non-decoded bits is placed logically at the end of the message and these bits are given the value zero, after which the relationship G(x) is applied to find the value of said bits. All that then remains to be done is to put these bits back in the proper place by circular permutation.

Example: assume the above message is decoded as follows:

10100 ??? 000111

The following circular permutation is performed:

00011110100 ???
and the ?s are replaced with 0s
00011110100000

This is divided by $G(x)=x^3+x+1$ which represents 1011 (in modulo-2 algebra without remainder) giving the following remainder: $011 \rightarrow x+1$, so the code word is: 000111101000111 and the missing bits 011 are put back into the proper place: 10100011000111, which is indeed the original message.

If the packet of missing bits is of length $\underline{b}$ bits where $b>k$, in the present case if $b>3$, then there are $2^{b-3}$ possible solutions.

Example: if $b=5$, then $5-3=2$ so there are $2^2=4$ possible solutions.

In practice, the following is performed:

As before, the $\underline{b}$ missing bits are moved to the end of the word:

101?????000111 which gives:

000111101?????

and the four words comprising all possible solutions for the first two missing bits are tried out, with the last three missing bits being set to 0:

1/ 00011110100000
2/ 00011110111000
3/ 00011110110000
4/ 00011110101000

The relationship $G(x)$ is applied to each of the four trial solutions to find the remainders, giving:

for 1/ 011 → 00011110100011
for 2/ 110 → 00011110111110
for 3/ 101 → 00011110110101
for 4/ 000 → 00011110101000

The four solutions are subjected to circular permutation to put the last five bits back into place:

```
1/  10100011000111
2/  10111110000111
3/  10110101000111
4/  10101000000111
```

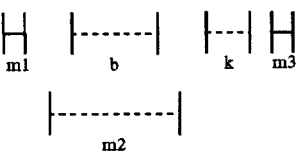

The proper word is then determined by applying likelihood criteria. In this case, it is the first.

In the example given, the message $\underline{m}$ is eleven bits long and three check bits $\underline{k}$ were required, giving a total length of fourteen bits: $n=14$, so it was necessary to find $G(x)$ for a code $C(n,n-k)=C(14,11)$. It is shown above that such a $G(x)$ exists, namely $x^3+x+1 \rightarrow 1011$.

Supposing that the message $\underline{m}$ has twelve bits and that $k=3$ check bits are still required, it is then necessary to find $G(x)$ of degree 3 suitable for generating a code $C(15,12)$.

Unfortunately, there is no $G(x)$ of degree 3 that divides $x^n-1=X^{15}-1$, so a search must be found for a value $n_1$ by increasing the number $\underline{n}$ by as little as possible so as to make it possible to form a code $C(n_1,n_1-3)$ having a generator polynomial $G(x)$.

It is found that for $n_1=16$ this is possible so a code $C(16,13)$ is constituted with the polynomial $G(x)$ being $x^3+x^2+x+1$. The length of a code word is $n_1=16$ bits, $n_1-n=1$ bit.

In this case, the m-bit message has a number $m4=1$ padding bits added thereto. There is no need to record it magnetically, but it must be taken into account when performing circular permutations, so it must be placed logically. It is can be placed in any position and it can be given either value: 0 or 1, it is only necessary to know its value and its position.

Given the error-locating technique adopted, the invention is unsuitable for correcting an error in which there is no anomaly in magnetic structure so the error itself cannot be located. This applies if a 0 becomes a 1 or vice versa. Nevertheless, by applying the relationship to the message as read, and observing that the remainder after division by $G(x)$ is not zero, it can still be detected that there is an error in the message.

Nevertheless, the main causes of errors observed in magnetic recordings are detected by the criteria adopted for locating an error. These causes are the following:

Transitions can be lost because of a hole in the message: for example the track may be damaged or the detection signal may disappear locally by dropping below a detection threshold.

There may be too many transitions, due essentially to noise which can randomly exceed the detection threshold.

Durations between transitions may vary due to various causes of track noise, including "jitter" in the speed with which a ticket passes through a magnetic reader.

There may be local superposition of two different messages because of deficiencies in head-to-track contact while magnetic writing was taking place.

We claim:

1. A system enabling a magnetic code recorded on a magnetic track deposited on a medium to be decoded properly in the form of a binary message, said magnetic code possibly including locatable spoiling over a length corresponding to a number $\underline{b}$ of bits referred to as an "error packet", said magnetic coding being of a type that causes elementary magnets to appear on the magnetic track of length $l_1=l\pm l/2$ and of length $l_2=2l\pm 2$, wherein a check structure in the form of a unitary packet of $\underline{k}$ bits is integrated in the message at a known location, said $\underline{k}$ bits being magnetically recorded on the track and being determined in such a manner that taken together, the message and the control structure constituting an n-bit word, belongs to a cyclic redundancy code $C(n,n-k)$ generated by a relationship, wherein the location of the beginning of any spoiling encountered during reading, is determined by observing one or other of the following events:

a) a magnet of length>$5l/2$ is detected;

b) a magnet of length<$l/2$ is detected;

c) a continuous run comprising an odd number of magnets of length $l_1$ is detected;

wherein, in such an event, the magnetic decoding into binary units stops at decoded bit of rank $N_1-1$ corresponding to the last magnet of correct length preceding event a) or b) or to the last magnet of length $l_2$ preceding event c), the end of the spoiling being located in the same manner, but by reading the n-bit word in the opposite direction, thereby obtaining decoding in the opposite direction as far as the last properly decoded bit of rank $N_2+1$ counting from the same origin as for the bit of rank $N_1-1$, and wherein the non-decoded bits of ranks $N_1$ to $N_2$ included, of number $b=N_2-(N_1-1)$ are determined by applying circular permutation to the n bits so as to place the $\underline{b}$ non-decoded bits at the end of the configuration, and by applying said relationship for generating the cyclic redundancy code that was used to determine said $\underline{k}$ check structure bits to said configuration with the $\underline{b}$ missing bits being provisionally reset to zero, the $\underline{b}$ bits found by applying the relationship then being returned to their original position by a new circular permutation.

2. A system according to claim 1, wherein the n-bit word comprises m=n−k bits made up of m1 start-of-message bits, m2 message data bits, m3 end-of-message bits, and m4 padding bits, where m4 is zero if there exists a cyclic redundancy code of length n=m+k=m1+m2+m3+k with $\underline{k}$ check bits, written C(n,n−k) and being non-zero otherwise, in which case m4 is chosen so as to increase the sum m1+m2+m3+k by as little as possible for there to exist a code C(n,n−k).

3. A system according to claim 2, wherein said m4 padding bits exist only logically and are not recorded magnetically on the magnetic track.

4. A system according to claim 3, wherein said m4 bits are logic 0s.

5. A system according to claim 3, wherein recording takes place on the magnetic track in the following order: m1, m2, $\underline{k}$, m3.

6. A system according to claim 5, wherein the m4 bits that are not magnetically recorded are placed logically in front of the m1 bits.

7. A system according to claim 1, wherein the relationship for generating said cyclic redundancy code is a generator polynomial G(x) of the degree $\underline{k}$ which divides the polynomial $x^n-1$ without remainder in modulo-2 algebra.

8. A system according to claim 7, wherein the said $\underline{k}$ check bits are obtained after logically placing the entire message of n−k bits in the following order: m3, m4, m1, m2 by circular permutation, and by logically adding $\underline{k}$ zero bits after the m2 bits, then representing the resulting n-bit structure by a polynomial N(x) of degree n−1, each term of the polynomial of degree corresponding to the rank of one of the bits in the structure, the first bit being of degree n−1, the second of degree n−2, etc...., to the last bit which is of degree zero, and each term of the polynomial having a coefficient $a_i$ equal to 0 or 1 depending on whether the bit represented by that term of the polynomial has the value 0 or 1, said polynomial formed in this way then being divided by said generator polynomial G(x), with the remainder after division constituting a polynomial R(x) representing a k-bit structure that is substituted for the $\underline{k}$ zero bits.

9. A system according to claim 1, wherein b≦k.

10. A system according to claim 1, wherein when b>k, the search for the $\underline{b}$ erroneous bits provides $2^{b-k}$ solutions which are found in succession by giving the b−k first bits of the b-bit error packet all possible configurations in succession, after which a likelihood criterion is used for selecting one of the $2^{b-k}$ solutions found in this way.

11. A system enabling a magnetic code recorded on a magnetic track deposited on a medium to be decoded properly in the form of a binary message, said magnetic code possibly including locatable spoiling over a length corresponding to a number $\underline{b}$ of bits referred to as an "error packet", said magnetic coding being of a type that causes elementary magnets to appear on the magnetic track of length $l_1=l\pm l/2$ and of length $l_2=2l\pm l/2$, wherein a check structure in the form of a unitary packet of $\underline{k}$ bits is integrated in the message at a known location, said $\underline{k}$ bits being magnetically recorded on the track and being determined in such a manner that taken together, the message and the control structure constituting an n-bit word, belongs to a cyclic redundancy code C(n,n−k) generated by a relationship, wherein the location of the beginning of any spoiling encountered during reading, is determined by observing one or other of the following events:

a) a magnet of length>5l/2 is detected;

b) a magnet of length<l/2 is detected;

c) a continuous run comprising an odd number of magnets of length $l_1$ is detected;

wherein, in such an event, the magnetic decoding into binary units stops at the decoded bit of rank $N_1-1$ corresponding to the last magnet of correct length preceding event a) or b) or to the last magnet of length $l_2$ preceding event c), decoding then continuing from rank $N_1+k$, written as $N_2+1$, thereby decoding the $\underline{n}$ bits with the exception of the $\underline{k}$ bits of ranks $N_1$ to $N_2$ included, and wherein these $\underline{k}$ bits are determined by applying circular permutation to the $\underline{n}$ bits so as to place the $\underline{k}$ non-decoded bits at the end of the configuration, and by applying said relationship for generating the cyclic redundancy code that was used to determine said $\underline{k}$ check-structure bits to said configuration with the $\underline{k}$ missing bits being provisionally reset to zero, the $\underline{k}$ bits found by applying the relationship then being returned to their original position by a new circular permutation.

\* \* \* \* \*